United States Patent [19]

Sawamura et al.

[11] Patent Number: 5,567,749

[45] Date of Patent: Oct. 22, 1996

[54] SEMICONDUCTOR DEVICE-ENCAPSULATING EPOXY RESIN COMPOSITION

[75] Inventors: Yasushi Sawamura, Aichi; Toshihiro Teshiba, Mie; Masayuki Tanaka, Aichi, all of Japan

[73] Assignee: Toray Industries, Inc.

[21] Appl. No.: 328,617

[22] Filed: Oct. 25, 1994

Related U.S. Application Data

[63] Continuation of Ser. No. 201,776, Feb. 25, 1994, abandoned, which is a continuation of Ser. No. 841,052, Feb. 25, 1992, abandoned.

[30] Foreign Application Priority Data

Feb. 26, 1991 [JP] Japan .................................. 3-030513
Feb. 26, 1991 [JP] Japan .................................. 3-030515
Feb. 27, 1991 [JP] Japan .................................. 3-032608

[51] Int. Cl.⁶ .................................................. C08L 63/00
[52] U.S. Cl. .................... 523/443; 523/457; 523/458; 523/459; 523/466; 523/481; 523/482; 523/485; 523/486; 523/487; 528/104
[58] Field of Search ............................... 523/443, 466, 523/457, 458, 459; 525/481, 485, 486, 487, 482; 528/104

[56] References Cited

U.S. PATENT DOCUMENTS 4,874,669 10/1989 Larson et al. ............................... 528/94

FOREIGN PATENT DOCUMENTS

| 31617 | 6/1969 | Australia . |
| 0355563 | 2/1990 | European Pat. Off. . |
| 0366068 | 5/1990 | European Pat. Off. . |
| 0384707 | 8/1990 | European Pat. Off. . |
| 0450944 | 10/1991 | European Pat. Off. . |
| 2208231 | 3/1989 | United Kingdom . |

*Primary Examiner*—Frederick Krass
*Attorney, Agent, or Firm*—Austin R. Miller

[57] ABSTRACT

A semiconductor-encapsulating composition comprised of (i) an epoxy resin preferably containing a bifunctional biphenyl-skeletal epoxy resin and/or a bifunctional naphthalene-skeletal epoxy resin, (ii) a curing agent containing 4,4'-dihydroxybiphenyl, and (iii) 70 to 95% by weight, based on the total epoxy resin composition, of a filler.

6 Claims, No Drawings

SEMICONDUCTOR DEVICE-ENCAPSULATING EPOXY RESIN COMPOSITION

This application is a continuation of application Ser. No. 08/201,776 filed Feb. 25, 1994, now abandoned, which is a continuation of application Ser. No. 07/841,052, filed Feb. 25, 1992, now abandoned.

BACKGROUND OF THE INVENTION (1) Field of the Invention

This invention relates to a semiconductor device-encapsulating epoxy resin composition which exhibits improved moisture-resistance after it is subjected to a thermal cycle, and which has low water absorption.

(2) Description of the Related Art

Epoxy resins have good heat resistance, moisture resistance and electrical characteristics, and various characteristics can be obtained by modifying the receipes thereof. Accordingly, epoxy resins are used as for paints, adhesives and industrial materials.

As methods of encapsulating electronic circuit parts such as semiconductor devices, known methods include a hermetic encapsulating method using metals or ceramics, and a resin encapsulating method using a phenol resin, a silicone resin, an epoxy resin or the like, but from the economical viewpoint, productivity and the balance among the physical properties, the resin encapsulating method using an epoxy resin is mainly adopted.

In the field of semiconductor integrated circuits, techniques of enhancing the integration degree have recently been developed, and the size of semiconductor elements is becoming large and the wirings in the elements are becoming fine. When such conductor elements are encapsulated with an epoxy resin, a strain occurs due to shrinkage caused by curing or thermal shrinkage caused by cooling. This strain leads to a shift of the aluminum wirings, breakage of the bonding wires and cracking in the semiconductor elements or the resin encapsulating the semiconductor device, with reduction in reliability.

As a curing agent for an epoxy resin, a phenolic novolak resin and a cresol-novolak resin have heretofore been used, but these novolak resins lave a problem such that the cured epoxy resin exhibits poor moisture resistance after it is subjected to a thermal cycle, and has a large water absorption.

It has been proposed to use 4,4'-dihydroxy-3,3',5,5'-tetramethylbiphenyl as the curing agent for an epoxy resin (see a preprint of the I.E.E.E. 1990 Conference, page 625). In this preprint, the solder cracking resistance of the epoxy encapsulating resin cured by using 4,4'-dihydroxy-3,3',5,5'-tetramethylbiphenyl is discussed. It is rather doubtful, however, whether this curing agent enhances the solder cracking resistance, and the reactivity of the curing agent is poor and the cured epoxy resin composition has a low glass transition temperature and a poor moisture resistance. Therefore, the cured epoxy resin composition has poor reliability and practicality.

SUMMARY OF THE INVENTION

Therefore, a primary object of the present invention is to solve the above-mentioned problems of the conventional semiconductor-encapsulating epoxy resin compositions, and to provide an epoxy resin composition which exhibits good reliability such as high moisture resistance after it is subjected to a thermal cycle and has a low water absorption, and thus, is suitable for encapsulating a semiconductor of a high integration degree for which high reliability is required.

Another object of the present invention is to provide a curing agent for a semiconductor-encapsulating epoxy resin composition exhibiting a high moisture resistance after the composition is subjected to a thermal cycle, and having low water absorption.

A further object of the present invention is to provide a semiconductor-encapsulating epoxy resin composition further exhibiting good solder dipping stability.

Other objects and advantages of the present invention will be apparent from the following description.

In accordance with the present invention, there is provided a semiconductor-encapsulating epoxy resin composition comprising (i) an epoxy resin, (ii) a curing agent comprising 4,4'-dihydroxybiphenyl, and (iii) 70 to 95% by weight, based on the weight of the epoxy resin composition, of a filler.

When the epoxy resin in the above-mentioned semiconductor-encapsulating epoxy resin composition comprises at least one bifunctional epoxy resin selected from a bifunctional epoxy resin having a biphenyl skeleton and a bifunctional epoxy resin having a naphthalene skeleton, the epoxy resin composition has an enhanced solder dipping stability.

DESCRIPTION OF THE PREFERRED EMBODIMENTS

The semiconductor-encapsulating epoxy resin composition of the present invention is characterized as comprising a curing agent comprised of 4,4'-dihydroxybiphenyl, and further comprising 70 to 95% by weight, based on the weight of the epoxy resin composition, of a filler.

By the inclusion of 4,4'-dihydroxybiphenyl in the curing agent, the molecular net-work structure of the epoxy resin curing system becomes large and the cured product has an enhanced elongation and toughness. Furthermore, it is believed that the net-work chain of the cured product exhibits a reduced movement in the rubbery region because the bifunctional curing agent has a rigid biphenyl skeleton. Therefore, in the course of cooling the cured product, vitrification proceeds from a non-equilibrium state wherein the free volume is large, and therefore, the resulting cured product has a reduced modulus of elasticity and reduced water absorption.

By the inclusion of a filler in an amount of 70 to 95% by weight based on the weight of the epoxy resin composition, the linear expansion coefficient of the cured product is reduced. Due to these effects obtained by the inclusion of 4,4'-dihydroxybiphenyl and the filler, the reliability such as a high moisture resistance after a thermal cycle becomes very high.

The epoxy resin incorporated in the composition of the present invention is not particularly limited provided that it has at least two epoxy groups in the molecule. As the epoxy resin, there can be mentioned, for example, a cresol-novolak epoxy resin, a bisphenol A epoxy resin, a linear aliphatic epoxy resin, an alicyclic epoxy resin, a heterocyclic epoxy resin and a spiro ring-containing epoxy resin.

The amount of the epoxy resin in the composition is preferably 3 to 25% by weight, more preferably 4 to 20% by weight, and most preferably 5 to 18% by weight, based on the weight of the composition. When the amount of the epoxy resin is too small, the epoxy resin composition has a poor shapability and adhesion. When the amount of the epoxy resin is too large, the linear expansion of the cured product becomes undesirably large and the occurrence of strain in the cured product is difficult to minimize.

The epoxy resin used is preferably selected from bifunctional epoxy resins having a biphenyl skeleton and bifunctional epoxy resins having a naphthalene skeleton. When these bifunctional epoxy resins are incorporated, cracking of the cured epoxy resin composition at the soldering step can be prevented, i.e., a good solder dipping stability can be obtained.

The bifunctional epoxy resins having a biphenyl radical include, for example, compounds represented by the following formula (I):

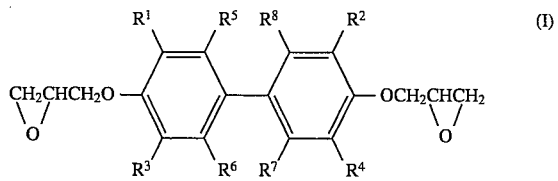

wherein each of $R^1$ through $R^8$ independently represents a hydrogen or halogen atom, or an alkyl group having 1 to 4 carbon atoms.

As preferred examples of $R^1$ through $R^8$ in the formula (I), there can be mentioned a hydrogen atom, a methyl group, an ethyl group, an n-propyl group, an i-propyl group, an n-butyl group, sec.-butyl group, a tert.-butyl group, a chlorine a tom and a bromine atom.

As specific examples of the biphenyl-skeletal epoxy resin, there can be mentioned 4,4'-bis(2,3-epoxypropoxy)biphenyl, 4,4'-bis(2,3-epoxypropoxy)-3,3',5,5'-tetramethylbiphenyl, 4,4'-bis(2,3-epoxypropoxy)-3,3',5,5'-tetramethyl-2-chlorobiphenyl, 4,4'-bis(2,3-epoxypropoxy)-3,3',5,5 -tetramethyl-2-bromobiphenyl, 4,4'-bis(2,3-epoxypropoxy)-3,3',5,5'-tetraethylbiphenyl and 4,4'-bis(2,3-epoxypropoxy)-3,3',5,5'-tetrabutylbiphenyl. Of these, 4,4'-bis(2,3-epoxypropoxy)biphenyl and 4,4'-bis(2,3-epoxypropoxy)-3,3',5,5 -tetramethylbiphenyl are especially preferable.

The bifunctional epoxy resins having a naphthalene radical include, for example, compounds represented by the following formula (II):

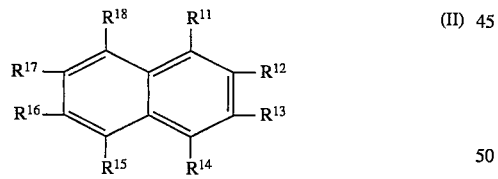

wherein two of $R^{11}$ through $R^{18}$ represent a 2,3-epoxyprpoxy group and the others independently represent a hydrogen atom, a halogen atom or an alkyl group having 1 to 4 carbon atoms.

As preferred examples of the groups "$R^{11}$ through $R^{18}$" other than a 2,3-epoxypropoxy group, there can be mentioned a hydrogen atom, a methyl group, an ethyl group, an n-propyl group, an i-propyl group, an n-butyl group, a sec.-buthyl group, a tert.-butyl group, a chlorine atom and a bromine atom.

As specific examples of the naphthalene-skeletal epoxy resin, there can be mentioned 1,5-bis(2,3-epoxypropoxy)naphthalene, 1,5-bis(2,3-epoxypropoxy)-7-methylnaphthalene, 1,6-bis(2,3-epoxypropoxy)naphthalene, 1,6 -bis(2,3-epoxypropoxy)-2-methylnaphthalene, 1,6-bis(2,3 -epoxypropoxy)-8-methylnaphthalene, 1,6-bis(2,3-epoxypropoxy)- 4,8-dimethylnaphthalene, 2-bromo-1,6-bis(2, 3-epoxypropoxy)naphthalene, 8-bromo-1,6-bis(2,3-epoxypropoxy)naphthalene and 2,7-bis(2,3-epoxypropoxy)naphthalene. Of these, 1,6-bis(2,3-epoxypropoxy)naphthalene is especially preferable.

If desired, the above-mentioned biphenyl-skeletal epoxy resin and naphthalene-skeletal epoxy resin can be used in combination with other epoxy resins which include, for example, a cresol-novolak epoxy resin, a phenol-novolak epoxy resin, other novolak epoxy resins such as those prepared from bisphenol A and resorcinol, a bisphenol A epoxy resin, a linear aliphatic epoxy resin, an alicyclic epoxy resin, a heterocyclic epoxy resin and a spiro ring-containing epoxy resin. For the purpose of enhancing the solder dipping stability of the cured epoxy resin composition to an appreciable extent, it is preferable that one or both of the biphenyl-skeletal epoxy resin and the naphthalene-skeletal epoxy resin occupy at least 50% by weight, more preferably at least 70% by weight of the total weight of the epoxy resins.

When the epoxy resin contains at least one bifunctional epoxy resin selected from bifunctional epoxy resins having a biphenyl skeleton and bifunctional epoxy resins having a naphthalene skeleton, the amount of the filler is preferably 75 to 95% by weight based on the total weight of the epoxy resin composition.

The curing agent used in the present invention comprises 4,4'-dihydroxybiphenyl as the essential ingredient. This compound is represented by the following formula (IV):

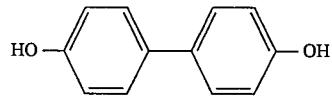

If 4,4'-dihydroxybiphenyl is not contained, the intended high reliability such as a high moisture resistance after a thermal cycle cannot be obtained.

The curing agent used in the present invention preferably comprises, in addition to the above-mentioned 4,4'-dihydroxybiphenyl, a polyfunctional curing agent as a crosslinking agent. Such curing agents include, for example, a phenol-novolak resin, a cresol-novolak resin, phenolic compounds represented by the following formula (III):

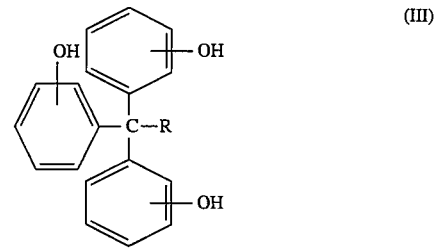

wherein R represents a hydrogen atom, an aryl group having 6 to 7 carbon atoms or an alkyl group having 1 to 4 carbon atoms, acid anhydrides such as maleic anhydride, phthalic anhydride and pyromellitic anhydride, and aromatic diamines such as m-phenylenediamine, diaminodiphenylmethane and diaminodiphenyl sulfone. Of these, a phenol-novolak resin and the compounds of the formula (III) are preferable in view of the reliability such as a high moisture resistance.

The proportion of 4,4'-dihydroxybiphenyl contained in the curing agent used is not particularly limited, but the curing agent used preferably contains 5 to 90% by weight, more preferably 20 to 70% by weight, based on the weight of 4,4'-dihydroxybiphenyl. The proportion of the polyfunctional curing agent used in combination with 4,4'-dihydroxybiphenyl is preferably 10 to 95% by weight based on the weight of the curing agent.

The amount of the curing agent is preferably 1 to 20% by weight, more preferably 2 to 15% by weight, based on the weight of the epoxy resin composition. In view of the mechanical properties and moisture resistance of the cured epoxy resin composition, the chemical equivalent ratio of the epoxy resin to the curing agent is preferably in the range of 0.5 to 1.5, more preferably 0.8 to 1.2.

In the epoxy resin composition of the present invention, a curing catalyst can be incorporated for promoting the curing reaction between the epoxy resin and the curing agent, and any compound capable of promoting the curing reaction can be used without limitation. As specific examples of the curing catalyst, there can be mentioned imidazole compounds such as 2-methylimidazole, 2,4-dimethylimidazole, 2-ethyl-4-methylimidazole, 2-phenylimidazole, 2-phenyl-4-methylimidazole and 2-heptadecylimidazole, tertiary amine compounds such as triethylamine, benzyldimethylamine, α-methylbenzyldimethylamine, 2-(dimethylaminomethyl)phenol, 2,4,6-tris(dimethylaminomethyl)phenol and 1,8-diazabicyclo(5,4,0)undecene-7, organic metal compounds such as zirconium tetramethoxide, zirconium tetrapropoxide, tetrakis(acetylacetonate)zirconium and tri(acetylacetonate)aluminum, and organic phosphine compounds such as triphenylphosphine, trimethylphosphine, triethylphosphine, tributylphosphine, tri(p-methylphenyl)phosphine and tri(nonylphenyl)phosphine. From the viewpoint of the moisture resistance, organic phosphine compounds are preferable and triphenylphosphine is especially preferable.

A mixture of two or more of these curing acatalysts can be used according to need. Preferably, the curing catalyst is incorporated in an amount of 0.1 to 10 parts by weight per 100 parts by weight of the epoxy resin.

As the filler incorporated in the epoxy resin composition of the present invention, there can be mentioned, for example, amorphous silica, crystalline silica, calcium carbonate, magnesium carbonate, alumina, magnesia, clay, talc, calcium silicate, titanium oxide, asbestos and a glass fiber. Of these, amorphous silica such as fused silica is preferable because it is effective for the reduction of the linear expansion coefficient and the minimization of occurrence of the strain in the cured epoxy resin composition. To reduce the linear expansion coefficient to an appreciable extent, the filler must be incorporated in an amount of 70 to 95% by weight, preferably 75 to 95% by weight and more preferably 75 to 90% by weight, based on the weight of the epoxy resin composition.

In view of the thermal soldering resistance, it is more preferable to incorporate an amorphous silica mixture comprising 60 to 95% by weight of pulverized amorphous silica, such as pulverized fused silica, having an average particle diameter of not larger than 10 microns and 40 to 5% by weight of spherical amorphous silica, such as spherical fused silica, having an average particle diameter of not larger than 40 microns. By the term "average particle diameter" herein used, we mean the median value of particle diameters as measured when the cumulative weight reaches 50%.

The filler to be incorporated in the epoxy resin composition can be previously surface-treated with a coupling agent such as a silane coupling agent or a titanate coupling agent to further enhance the reliability of the cured epoxy resin composition. As the coupling agent, silane coupling agents such as an epoxy silane, an amino-silane and a mercapto-silane are preferable.

A halogen compound such as a halogenated epoxy resin, flame retardant such as a phosphorus compound, a flame retardant assistant such as antimony trioxide, a colorant such as carbon black or iron oxide, an elastomer such as a silicone rubber, a styrene-conjugated diene block copolymer, a modified nitrile rubber, a modified polybutadiene rubber or a modified silicone oil, a thermoplastic resin such as polyethylene, a release agent such as a long-chain fatty acid, a metal salt of a long-chain fatty acid, an ester of a long-chain fatty acid, an amide of a long-chain fatty acid or a paraffin wax, and a crosslinking agent can be incorporated in the epoxy resin composition of the present invention.

The epoxy resin composition of the present invention can be prepared by melt-kneading according to a known kneading method using, for example, a Banbury mixer, a kneader, a roll, a single-screw or twin-screw extruder, or a cokneader The present invention will now be described in detail with reference to the following examples.

Examples 1 through 3 and Comparative Examples 1 through 3

The ingredients shown in Table 1 were dry-blended together at the mixing ratios shown in Table 2 by using a mixer. Each dry-blended mixture was heated and kneaded for 5 minutes by using a mixing roll, the surface of which was maintained at 90° C., and then cooled and pulverized to give a powdery epoxy resin composition.

TABLE 1

| | |
|---|---|
| Epoxy resin (I) | Cresol-novolak type epoxy resin having an epoxy equivalent of 200 |
| Epoxy resin (II) | 4,4'-Bis(2,3-epoxypropoxy)-3,3',5,5'-tetra methylbiphenyl |
| Epoxy resin (III) | 1,6-Bis(2,3-epoxypropoxy)naphthalene |
| Curing agent (I) | Phenol-novolak resin having a hydroxyl equivalent of 107 |
| Curing agent (II) | 4,4'-Dihydroxybiphenyl |
| Curing agent (III) | 4,4'-Dihydroxy-3,3',5,5'-tetramethylbiphenyl |
| Curing agent (IV) | Tris(hydroxyphenyl)methane having a hydroxyl equivalent of 97 |
| Filler (I) | Pulverized amorphous silica having an average particle diameter of 13.6 μm |
| Filler (II) | Pulverized amorphous silica having an average particle diameter of 8.9 μm |
| Filler (III) | Spherical amorphous silica having an average particle diameter of about 24 μm |
| Curing catalyst | Triphenylphosphine |
| Release agent | Stearic acid |
| Flame retardant | Brominated phenol-novolak type epoxy resin having an epoxy equivalent of 270 and a bromine content of 36% by weight |
| Flame retardant assistant | Antimony trioxide |
| Colorant | Carbon black |
| Silane coupling agent | γ-Glycidoxypropyltrimethoxysilane |

TABLE 2

Composition of Epoxy Resin Compositions (% by weight)

| Ingredients | Example 1 | Example 2 | Example 3 | Comp. Ex. 1 | Comp. Ex. 2 | Comp. Ex. 3 |
|---|---|---|---|---|---|---|
| Epoxy resin (I) | 13.52 | 13.66 | 13.97 | 13.37 | 13.11 | 17.98 |
| Curing agent (I) | 6.33 | 4.65 | — | 8.06 | 4.98 | 5.63 |
| Curing agent (IV) | — | — | 4.47 | — | — | — |

TABLE 2-continued

Composition of Epoxy Resin Compositions (% by weight)

| Ingredients | Example 1 | Example 2 | Example 3 | Comp. Ex. 1 | Comp. Ex. 2 | Comp. Ex. 3 |
|---|---|---|---|---|---|---|
| Curing agent (II) | 1.58 | 3.12 | 2.99 | — | — | 3.76 |
| Curing agent (III) | — | — | — | — | 3.34 | — |
| Curing catalyst | 0.27 | 0.27 | 0.27 | 0.27 | 0.27 | 0.33 |
| Filler (I) | 51.1 | 51.1 | 51.1 | 51.1 | 51.1 | 46.9 |
| Filler (III) | 21.9 | 21.9 | 21.9 | 21.9 | 21.9 | 20.1 |
| Silane coupling agent | 1.0 | 1.0 | 1.0 | 1.0 | 1.0 | 1.0 |
| Flame retardant | 2.3 | 2.3 | 2.3 | 2.3 | 2.3 | 2.3 |
| Flame retardant assistant | 1.5 | 1.5 | 1.5 | 1.5 | 1.5 | 1.5 |
| Release agent | 0.3 | 0.3 | 0.3 | 0.3 | 0.3 | 0.3 |
| Colorant | 0.2 | 0..2 | 0.2 | 0.2 | 0.2 | 0.2 |

The powdery epoxy resin composition was molded by a low-pressure transfer molding method wherein the heating temperature and the heating time was set at 175° C. and two minutes, respectively. The physical properties of the molded product were evaluated by the following methods and the results are shown in Table 3.

Pressure Cooker Bias Test (PCBT) after Thermal Cycle (Moisture Resistance)

Five 152-pin QFPs having encasulated test elements were molded, and post curing was carried out at 180° C. for 5 hours. A thermal cycle of −55° C. to 150° C. was repeated 100 times and then each QFP was subjected to the unsaturated pressure cooker bias test (USPCBT) at a temperature of 125° C. and a relative humidity of 85% under a bias voltage of 10 V, and the time required for the cumulative failure rate to reach 50% was measured.

Water Absorption

Ten 44-pin QFPs were molded, and post curing was carried out at 180° C. for 5 hours. Then the package of the QFPs was allowed to stand at a temperature of 85° C. and a relative humidity of 85% for 96 hours, and the water absorption (% by weight) was measured.

Gel Time

The curing property of the powdery epoxy resin composition was evaluated on a specimen placed on a brass plate maintained at a temperature of 177° C.

TABLE 3

| Properties | Example 1 | Example 2 | Example 3 | Comp. Ex. 1 | Comp. Ex. 2 | Comp. Ex. 3 |
|---|---|---|---|---|---|---|
| Gel time (sec) | 28 | 30 | 28 | 28 | 53 | 32 |
| Water absorption (%) | 0.35 | 0.32 | 0.36 | 0.41 | 0.32 | 0.40 |
| PCBT after thermal cycle (hr) | 290 | 310 | 350 | 180 | 70 | 240 |

As seen from the results shown in Table 3, the epoxy resin compositions of the present invention exhibit good and balanced water absorption and moisture resistance after thermal cycle (Examples 1, 2 and 3).

An epoxy resin composition containing a curing agent which does not contain 4,4'-dihydroxybiphenyl exhibits a large water absorption and a poor moisture resistance after a thermal cycle (Comparative Example 1). An epoxy resin composition containing a curing agent which contains 4,4'-dihydroxybiphenyl having four methyl groups in the molecule exhibits a very poor moisture resistance after thermal cycle (Comparative Example 2). This would be due to the fact that 4,4'-dihydroxy-3,3',5,5'tetramethylbiphenyl has a large steric hindrance and the hydroxyl groups have a low reactivity. An epoxy resin composition containing a filler in an amount smaller than 70% by weight based on the weight of the composition exhibits a large water absorption and a poor moisture resistance after thermal cycle (Comparative Example 3).

Examples 4 through 7 and Comparative Examples 4 through 7

The ingredients shown in Table 1 were dry-blended together at the mixing ratios shown in Table 4 by using a mixer. Each dry-blended mixture was heated and kneaded for 5 minutes by using a mixing roll, the surface of which was maintained at 90° C., and then cooled and pulverized to give a powdery epoxy resin composition.

TABLE 4

Compositions of Epoxy Resin Compositions (% by weight)

| Ingredients | Ex. 4 | Ex. 5 | Ex. 6 | Ex. 7 | Comp. Ex. 4 | Comp. Ex. 5 | Comp. Ex. 6 | Comp. Ex. 7 |
|---|---|---|---|---|---|---|---|---|
| Epoxy resin (I) | — | — | — | — | — | — | 8.68 | — |
| Epoxy resin (II) | 8.54 | 8.60 | 8.70 | 8.88 | 8.49 | 8.41 | — | 17.16 |
| Curing agent (I) | 5.15 | 4.53 | 3.89 | — | 5.77 | 4.68 | 5.63 | 8.21 |
| Curing agent (IV) | — | — | — | 4.30 | — | — | — | — |
| Curing agent (II) | 0.57 | 1.13 | 1.67 | 1.08 | — | — | — | 2.05 |
| Curing agent (III) | — | — | — | — | — | 1.17 | — | — |
| Curing catalyst | 0.24 | 0.24 | 0.24 | 0.24 | 0.24 | 0.24 | 0.19 | 0.28 |
| Filler (II) | 56.14 | 56.14 | 56.14 | 56.14 | 56.14 | 56.14 | 56.14 | 46.90 |
| Filler (III) | 24.06 | 24.06 | 24.06 | 24.06 | 24.06 | 24.06 | 24.06 | 20.10 |
| Silane coupling agent | 1.00 | 1.00 | 1.00 | 1.00 | 1.00 | 1.00 | 1.00 | 1.00 |
| Flame retardant | 2.30 | 2.30 | 2.30 | 2.30 | 2.30 | 2.30 | 2.30 | 2.30 |
| Flame retardant assistant | 1.50 | 1.50 | 1.50 | 1.50 | 1.50 | 1.50 | 1.50 | 1.50 |
| Release agent | 0.30 | 0.30 | 0.30 | 0.30 | 0.30 | 0.30 | 0.30 | 0.30 |
| Colorant | 0.20 | 0.20 | 0.20 | 0.20 | 0.20 | 0.20 | 0.20 | 0.20 |

The powdery epoxy resin composition was molded by a low-pressure transfer molding method wherein the heating temperature and the heating time were set at 175° C. and two minutes, respectively. The physical properties of the molded product were evaluated by the following methods and the results are shown in Table 5.

Thermal Soldering Resistance

Twenty 80-pin QFPs having encapsulated test elements were molded, and post curing was carried out at 180° C. for five hours. The QFPs were humidified at a temperature of 85° C. and a relative humidity of 85% for 72 hours, and then maintained at a temperature of 245° C. for 10 seconds in an IR reflow oven and the ratio (%) of QFPs, in which cracking did not occur, was determined.

PCBT after Solder Dipping

The 80-pin QFPs which had been subjected to a solder dipping treatment were subjected to the unsaturated pressure cooker bias test (USPCBT) at a temperature of 125° C. and a relative humidity of 85% under a bias voltage of 10 V, and the time required for the cumulative failure rate to reach 50% was measured.

Glass Transition Temperature (Tg)

A test specimen having a length of 12.7 mm was heated at a temperature elevation rate of 10° C./min by using a TMA apparatus, and the glass transition temperature (Tg) was measured.

mixer. Each dry-blended mixture was heated and kneaded for 5 minutes by using a mixing roll, the surface of which was mantained at 90° C., and then cooled and pulverized to give a powdery epoxy resin composition.

TABLE 6

| Compositions of Epoxy Resin Compositions (% by weight) | | | | | | | |
|---|---|---|---|---|---|---|---|
| Ingredients | Ex. 8 | Ex. 9 | Ex. 10 | Ex. 11 | Comp. Ex. 8 | Comp. Ex. 9 | Comp. Ex. 10 |
| Epoxy resin (I) | — | — | — | — | — | — | — |
| Epoxy resin (II) | — | — | — | — | — | — | — |
| Epoxy resin (III) | 7.97 | 8.08 | 8.19 | 8.34 | 7.91 | 7.79 | 15.78 |
| Curing agent (I) | 5.89 | 4.50 | 3.16 | — | 6.60 | 4.70 | 8.19 |
| Curing agent (IV) | — | — | — | 4.32 | — | — | — |
| Curing agent (II) | 0.65 | 1.93 | 3.16 | 1.85 | — | — | 3.51 |
| Curing agent (III) | — | — | — | — | — | 2.02 | — |
| Curing catalyst | 0.19 | 0.19 | 0.19 | 0.19 | 0.19 | 0.19 | 0.22 |
| Filler (II) | 56.00 | 56.00 | 56.00 | 56.00 | 56.00 | 56.00 | 46.90 |
| Filler (III) | 24.00 | 24.00 | 24.00 | 24.00 | 24.00 | 24.00 | 20.10 |
| Silane | 1.00 | 1.00 | 1.00 | 1.00 | 1.00 | 1.00 | 1.00 |

TABLE 5

| Properties | Ex. 4 | Ex. 5 | Ex. 6 | Ex. 7 | Comp. Ex. 4 | Comp. Ex. 5 | Comp. Ex. 6 | Comp. Ex. 7 |
|---|---|---|---|---|---|---|---|---|
| Thermal soldering resistance (%) | 80 | 85 | 80 | 100 | 40 | 0 | 0 | 0 |
| PCBT after solder dipping (hr) | 290 | 300 | 300 | 560 | 170 | 70 | 110 | 70 |
| Tg | 135 | 134 | 134 | 153 | 135 | 123 | 156 | 133 |

As seen from the results shown in Table 5, the epoxy resin compositions of the present invention exhibit a good and balanced solder dipping stability and moisture resistance (PCBT after solder dipping). Especially, an epoxy resin composition containing tris(hydroxyphenyl)methane as a curing agent exhibits an excellent solder dipping stability and moisture resistance after solder dipping (Example 7).

An epoxy resin composition wherein the curing agent does not contain 4,4'-dihydroxybiphenyl exhibits a poor solder dipping stability and moisture resistance after solder dipping (Comparative Example 4), compared with the corresponding epoxy resin compositions of the present invention. An epoxy resin composition wherein the curing agent does not contain 4,4'-dihydroxybiphenyl, but contains 4,4'-dihydroxy-3,3',5,5'-tetramethylbiphenyl exhibits a poor solder dipping stability and moisture resistance after solder dipping and had a low glass transition temperature (Tg) (Comparative Example 5). An epoxy resin composition containing smaller than 70% by weight of a filler also exhibits a poor solder dipping stability and moisture resistance after solder dipping (Comparative Example 7).

Examples 8 through 11 and Comparative Examples 8 through 10

The ingredients shown in Table 1 were dry-blended together at the mixing ratios shown in Table 6 by using a TABLE 6-continued

| Compositions of Epoxy Resin Compositions (% by weight) | | | | | | | |
|---|---|---|---|---|---|---|---|
| Ingredients | Ex. 8 | Ex. 9 | Ex. 10 | Ex. 11 | Comp. Ex. 8 | Comp. Ex. 9 | Comp. Ex. 10 |
| coupling agent | | | | | | | |
| Flame retardant | 2.30 | 2.30 | 2.30 | 2.30 | 2.30 | 2.30 | 2.30 |
| Flame retardant assistant | 1.50 | 1.50 | 1.50 | 1.50 | 1.50 | 1.50 | 1.50 |
| Release agent | 0.30 | 0.30 | 0.30 | 0.30 | 0.30 | 0.30 | 0.30 |
| Colorant | 0.20 | 0.20 | 0.20 | 0.20 | 0.20 | 0.20 | 0.20 |

The powdery epoxy resin composition was molded by a low-pressure transfer molding method wherein the heating temperature and the heating time were set at 175° C. and two minutes, respectively. The physical properties of the molded product were evaluated by the following methods. The results are shown in Table 7.

Thermal Soldering Resistance

Sixteen 28-pin TSOPs having encapsulated test elements were molded, and post curing was carried out at 180° C. for 5 hours. The TSOPs were humidified at a temperature of 85° C. and a relative humidity of 85% for 16 hours, and then maintained at a temperature of 245° C. for 10 seconds in an IR reflow oven, and the ratio (%) of TSOPs, in which cracking did not occur, was determined.

PCBT after Solder Dipping

The 28-pin TSOPs which had been subjected to a solder dipping treatment were subjected to the unsaturated pressure cooker bias test (USPCBT) at a temperature of 125° C. and a relative humidity of 85% under a bias voltage of 10 V, and the time required for the cumulative failure rate to reach 50%, was determined.

Glass Transition Temperature (Tg)

A test specimen having a length of 12.7 mm was heated at a temperature elevation rate of 10° C./min by using a TMA apparatus, and the glass transition temperature (Tg) was measured.

TABLE 7

| Properties | Ex. 8 | Ex. 9 | Ex. 10 | Ex. 11 | Comp. Ex. 8 | Comp. Ex. 9 | Comp. Ex. 10 |
| --- | --- | --- | --- | --- | --- | --- | --- |
| Thermal soldering resistance(%) | 44 | 69 | 63 | 75 | 25 | 0 | 0 |
| PCBT after solder dipping (hr) | 240 | 250 | 230 | 390 | 190 | 105 | 90 |
| Tg | 141 | 142 | 135 | 155 | 141 | 128 | 133 |

As seen from the results shown in Table 7, the epoxy resin compositions of the present invention exhibit a good and balanced solder dipping stability and moisture resistance (PCBT after solder dipping)(Examples 8 through 10). Especially, an epoxy resin composition containing tris(hydroxyphenyl)methane as a curing agent exhibits an excellent soplder dipping stability and moisture resistance after solder dipping (Example 11).

An epoxy resin composition wherein the curing agent does not contain 4,4'-dihydroxybiphenyl exhibits a poor solder dipping stability and moisture resistance after solder dipping (Comparative Example 8), compared with the corresponding epoxy resin composition of the present invention. An epoxy resin composition wherein the curing agent does not contain 4,4'-dihydroxybiphenyl, but contains 4,4'-dihydroxy-3,3',5,5'-tetramethylbiphenyl exhibits a poor solder dipping stability and moisture resistance after solder dipping and had a low glass transition temperature (Tg) (Comparative Example 9). An epoxy resin composition containing smaller than 70% by weight of a filler also exhibits a poor solder dipping stability and moisture resistance after solder dipping (Comparative Example 10).

What we claim is:

1. A semiconductor-encapsulating epoxy resin composition comprising (i) an epoxy resin, (ii) a curing agent comprising a mixture of 4,4'-dihydroxybiphenyl and a tri- or higher polyphenol, and (iii) 75 to 95% by weight, based on the total weight of said epoxy resin composition, of a filler; said epoxy resin including at least one bifunctional epoxy resin selected from the group consisting of bifunctional epoxy resins having a biphenyl radical represented by the following formula (I):

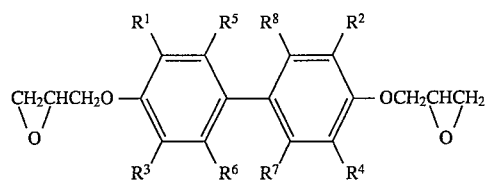

wherein each of $R^1$ through $R^8$ independently represents a hydrogen atom, a halogen atom or an alkyl group having 1 to 4 carbon atoms, and bifunctional epoxy resins having a naphthalene radical represented by the following formula (II):

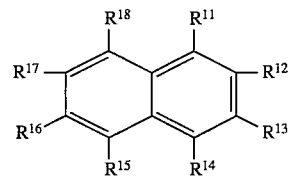

wherein two of $R^{11}$ through $R^{18}$ represent a 2,3-epoxypropoxy group and the others independently represent a hydrogen atom, a halogen atom or an alkyl group having 1 to 4 carbon atoms.

2. An epoxy resin composition according to claim 1, wherein the amount of the bifunctional epoxy resin or resins selected from the bifunctional biphenyl-radical epoxy resins and the bifunctional naphthalene-radical epoxy resins, is at least 50% by weight based on the weight of the epoxy resin (i).

3. An epoxy resin composition according to claim 1, wherein the curing agent comprises, based on the weight of the curing agent, 5 to 90% by weight of said 4,4'-dihydroxybiphenyl and 10 to 95% by weight of said tri- or higher polyphenol.

4. An epoxy resin composition according to claim 1, wherein the amount of the epoxy resin (i) is 3 to 25% by weight based on the total weight of the epoxy resin composition.

5. An epoxy resin composition according to claim 1, wherein the amount of the curing agent is such that the chemical equivalent ratio of the curing agent to the epoxy resin (i) is in the range of 0.5 to 1.5.

6. A semiconductor-encapsulating epoxy resin composition comprising (i) an epoxy resin, (ii) a curing agent comprising a mixture of 4,4'-dihydroxybiphenyl and another polyfunctional compound selected from the group consisting of a phenol-novolak resin, a cresol-novolak resin, and phenolic compounds represented by the following formula (III):

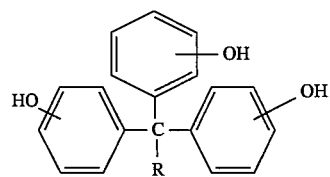

wherein R represents a hydrogen atom, an aryl group having 6 to 7 carbon atoms or an alkyl group having 1 to 4 carbon atoms, and (iii) 75 to 95% by weight, based on the total weight of said epoxy resin composition, of a filler; said epoxy resin including at least one bifunctional epoxy resin selected from the group consisting of bifunctional epoxy resins having a biphenyl radical represented by the following formula (I):

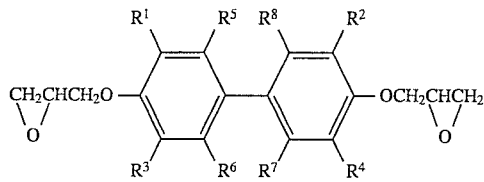

wherein each of $R^1$ through $R^8$ independently represents a hydrogen atom, a halogen atom or an alkyl group having 1 to 4 carbon atoms, and bifunctional epoxy resins having a naphthalene radical represented by the following formula (II):

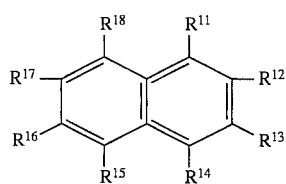

wherein two of $R^{11}$ through $R^{18}$ represent a 2,3-epoxypropoxy group and the others independently represent a hydrogen atom, a halogen atom or an alkyl group having 1 to 4 carbon atoms.

* * * * *